US012710181B2

(12) United States Patent
Lara Calderón et al.

(10) Patent No.: US 12,710,181 B2
(45) Date of Patent: Aug. 18, 2026

(54) HOODS FOR EXTRACTING COOKING FUMES, COMPRISING FIRST AND SECOND SUCTION UNITS

(71) Applicant: Elica S.p.A., Fabriano (IT)

(72) Inventors: Eduardo Lara Calderón, Fabriano (IT); Efraín Cruz Trejo, Fabriano (IT)

(73) Assignee: Elica S.p.A., Fabriano (IT)

( * ) Notice: Subject to any disclaimer, the term of this patent is extended or adjusted under 35 U.S.C. 154(b) by 909 days.

(21) Appl. No.: 17/852,637

(22) Filed: Jun. 29, 2022

(65) Prior Publication Data

US 2023/0003393 A1 Jan. 5, 2023

(30) Foreign Application Priority Data

Jun. 30, 2021 (IT) ........................ 102021000017141

(51) Int. Cl.
*F24C 15/20* (2006.01)
*A47J 36/38* (2006.01)
(Continued)

(52) U.S. Cl.
CPC .......... *F24C 15/2042* (2013.01); *F24C 15/20* (2013.01); *A47J 36/38* (2013.01);
(Continued)

(58) Field of Classification Search
CPC ....... A47J 36/38; F24C 15/20; F24C 15/2042; F24C 15/2071; H05B 6/6423;
(Continued)

(56) References Cited

U.S. PATENT DOCUMENTS 5,927,268 A * 7/1999 Chiang ................... F24C 15/20 126/299 R
2019/0128535 A1* 5/2019 Chien ..................... F24C 15/20

FOREIGN PATENT DOCUMENTS

CN 107023863 A 8/2017
CN 109297060 A * 2/2019 .......... F24C 15/2085
(Continued)

OTHER PUBLICATIONS

CN 109297060 A—Translation (Year: 2019).*
(Continued)

*Primary Examiner* — Helena Kosanovic
*Assistant Examiner* — Benjamin W Johnson
(74) *Attorney, Agent, or Firm* — MH2 Technology Law Group LLP

(57) ABSTRACT

A hood for extracting cooking fumes may include: a base having an intake opening; a conduit connected to the base, with a discharge opening in fluid communication with the intake opening; and first and second suction units in the conduit to respectively generate first and second air flows that cross the conduit from the intake to the discharge openings. The first suction unit may be closer to the intake opening than the second suction unit. The first and second suction units may partially overlap along a transverse direction. The hood further may include separating members in the conduit to define first and second suction chambers, each in fluid communication with the intake and discharge openings. The first air flow may cross the first suction chamber from the intake to the discharge opening. The second air flow may cross the second suction chamber from the intake to the discharge opening.

9 Claims, 8 Drawing Sheets

(51) Int. Cl.
*B08B 15/02* (2006.01)
*F04D 29/42* (2006.01)
*H05B 6/64* (2006.01)
*H05K 5/00* (2006.01)
*H05K 7/20* (2006.01)

(52) U.S. Cl.
CPC ............ *B08B 15/02* (2013.01); *F04D 29/424* (2013.01); *F04D 29/4246* (2013.01); *F04D 29/4253* (2013.01); *F24C 15/2071* (2013.01); *H05B 6/6423* (2013.01); *H05K 5/00* (2013.01); *H05K 7/20* (2013.01); *H05K 7/20136* (2013.01); *H05K 7/20145* (2013.01)

(58) Field of Classification Search
CPC ... B08B 15/02; F04D 29/424; F04D 29/4246; F04D 29/4253; H05K 5/00; H05K 7/20; H05K 7/20136; H05K 7/20145
USPC .................................... 126/303; 454/67, 184
See application file for complete search history.

(56) References Cited

FOREIGN PATENT DOCUMENTS

| | | | | |
|---|---|---|---|---|
| CN | 112648664 A | | 4/2021 | |
| DE | 202018105587 U1 | * | 12/2018 | .............. F24C 15/20 |

OTHER PUBLICATIONS

DE 202018105587 U1—Translation (Year: 2018).*
Italian Search Report and Written Opinion in corresponding Italian Application No. 102021000017141 mailed on Mar. 22, 2022, 15 pages.

* cited by examiner

HOODS FOR EXTRACTING COOKING FUMES, COMPRISING FIRST AND SECOND SUCTION UNITS

CROSS-REFERENCE TO RELATED APPLICATION(S)

This application claims priority under 35 U.S.C. § 119 from Italian Patent Application No. 102021000017141, filed on Jun. 30, 2021, in the Italian Patent and Trademark Office ("IPTO"), the entire contents of which are incorporated herein by reference.

TECHNICAL FIELD

The present description relates to a hood for extracting cooking fumes in accordance with the preamble to claim 1.

The object of the present description is used in the field of kitchen appliances, in particular in that of equipment for extracting cooking fumes.

BACKGROUND ART

Kitchen hoods have long been known in the state of the art, i.e., appliances designed to extract vapours and odours produced by food during cooking.

Typically, such kitchen hoods have a T-shaped main body consisting of a base comprising an intake opening, and a conduit having a discharge opening placed in fluid communication with the intake opening. Such a conduit mainly extends along a longitudinal direction, while the base extends in a plane along a transverse direction orthogonal to the longitudinal direction, and along a depth direction perpendicular to the longitudinal and transverse directions.

At least one suction unit configured to generate an air flow through the conduit from the intake opening to the discharge opening is arranged within the conduit. The suction unit comprises an impeller rotated by an electric motor along a rotation axis typically oriented along the depth or transverse direction.

In particular, in the state of the art, kitchen hoods are known with a double suction unit configured to generate a greater suction effect of the cooking fumes than those with a single suction unit.

In detail, this last type of hood has a first and a second suction unit arranged in the conduit at the same distance from the intake opening along the longitudinal direction. In greater detail, the first and the second suction unit extend parallel along the depth direction and are arranged side by side along the transverse direction.

The flanking of the first and the second suction unit along the transverse direction results in a significant increase in the volume of the conduit along the latter direction with respect to the hoods with a single suction unit. Therefore, disadvantageously, in the case in which the hood is recessed in a hanging cabinet, the greater encumbrance along the transverse direction of the conduit leads to a reduction in the cubic area of the cabinet useful for the storage of food products or kitchen equipment.

Furthermore, the greater size of the conduit of the hoods with double suction unit entails an increase in the raw materials necessary for their creation and countless logistical disadvantages that result in an increase in production and storage costs.

Again, disadvantageously, the greater size of the conduit and thus the greater weight of the hood with a double suction unit make installation operations less easy and more expensive in terms of time.

OBJECT OF THE INVENTION

In this context, the technical task underlying the present description is to propose a hood for extracting cooking fumes which overcomes the drawbacks of the prior art mentioned above.

In particular, it is an object of the present invention to provide a hood for extracting cooking fumes with a double suction unit having an overall encumbrance comparable to that of the common hoods with a single suction unit. Therefore, it is an object of the present invention to provide a hood with a double suction unit which, if recessed in a hanging cabinet, can occupy the smallest possible volume, so as to maximise the storage capacity of the cabinet itself.

Furthermore, it is an object of the present invention to provide a hood with a double suction unit which is light and of small dimensions so as to be economically feasible, efficiently storable and easy to install.

SUMMARY OF THE INVENTION

The hood object of the present description comprises a base having an intake opening that can be facing a hob, and a conduit connected to the base.

In detail, the conduit extends mainly along a longitudinal direction and has a discharge opening placed in fluid communication with the intake opening.

The hood further comprises a first and a second suction unit arranged in the conduit and configured to generate a respective air flow through the conduit from the intake opening to the discharge opening.

In detail, the first and the second suction unit extend parallel along a depth direction oriented perpendicular to the longitudinal direction.

The first suction unit is placed close to the opening and the second suction unit is spaced from the first along the longitudinal direction.

Advantageously, such a distance of the suction units along the longitudinal direction allows a partial overlapping thereof along a transverse direction oriented perpendicularly to the longitudinal direction and to the depth direction. It is thus evident that by doing so it is possible to reduce the extension of the conduit along the transverse direction, and consequently increase the useful storage volume of any hanging cabinets in which the hood is recessed.

Furthermore, advantageously, the hood object of the present invention, by contracting the transverse extension of the conduit, is capable of reducing production costs, reducing the amount of raw materials necessary for the construction of the hood, facilitating installation operations by reducing the weight and bulk of the conduit, and allows an efficient storage of the hoods by maximising the number of units which can be placed in a given volume of space.

LIST OF FIGURES

Further features and advantages of the present description will become clearer from the indicative, and therefore non-limiting, description of a preferred but non-exclusive embodiment of a hood for extracting cooking fumes, as illustrated in the appended figures in which:

FIG. 1 is a perspective view from below of a hood in accordance with the present description;

FIG. 2*a* shows a view from below of the hood of FIG. 1;

FIG. 2*b* shows a top view of the hood of FIG. 1;

DETAILED DESCRIPTION

With reference to the accompanying figures, the present description relates to a hood 1 for extracting vapours and odours produced by food during cooking.

Figure 1:
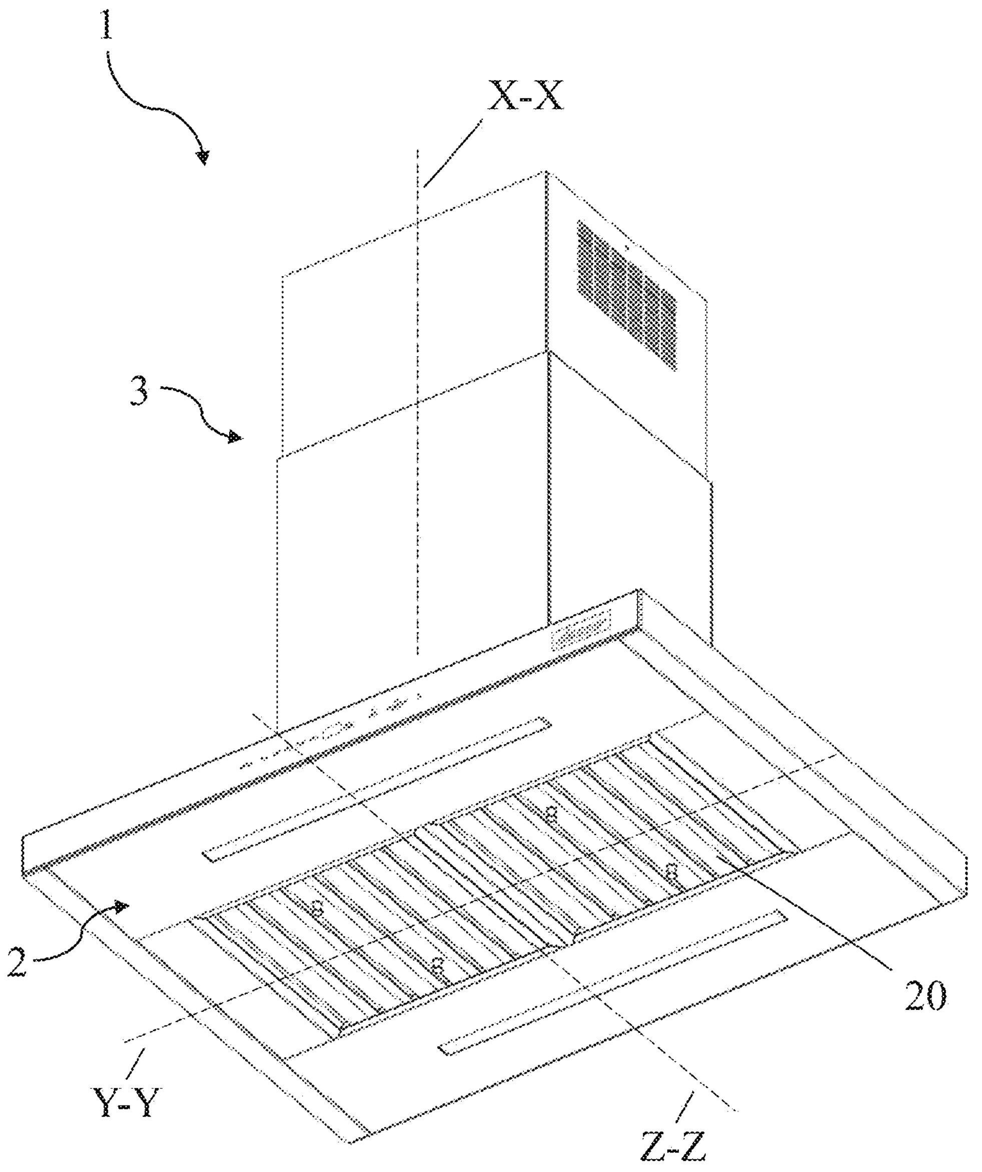

As shown in FIG. 1, the hood 1 object of the present description comprises a base 2 having an intake opening 20 that can be facing a hob.

Figure 2A:
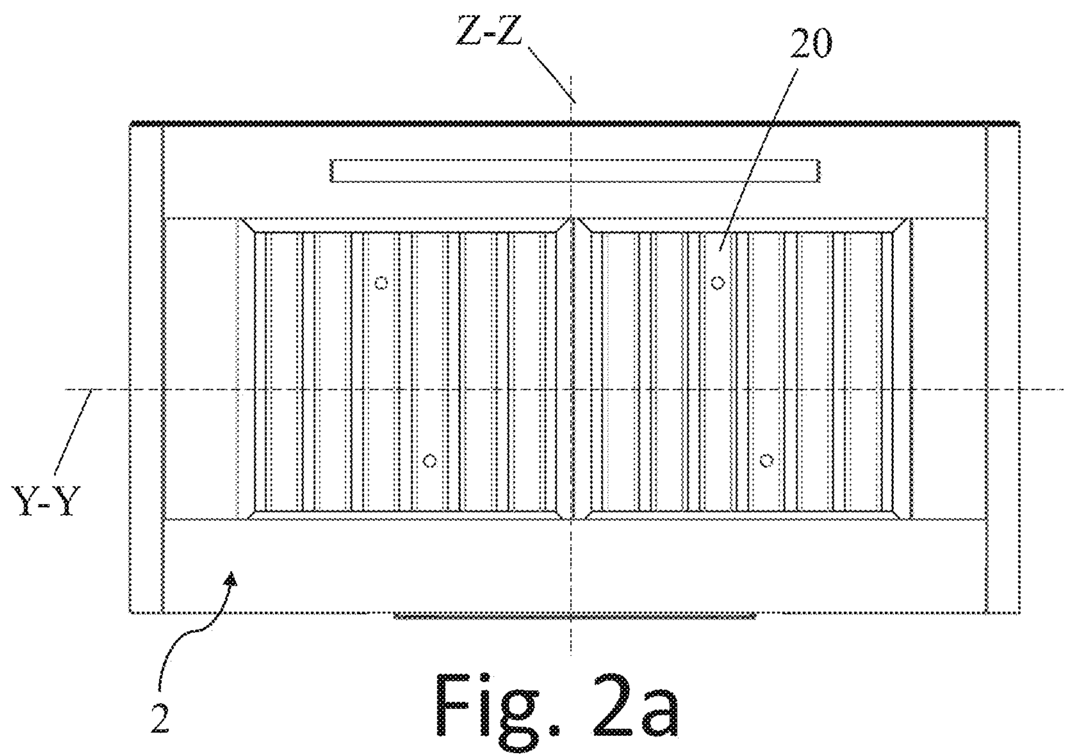

Preferably, but not necessarily, said base 2 is flat and extends along a transverse direction Y-Y and a depth direction Z-Z, in accordance with what is indicated in FIG. 2*a*.

Furthermore, the hood 1 object of the present description comprises a conduit 3 connected to the base 2 and extending mainly along a longitudinal direction X-X oriented orthogonally to the transverse direction Y-Y and to the depth direction Z-Z. Therefore, in the case in which the base 2 has a predominantly flat extension, the conduit 3 is oriented orthogonally to the plane in which the base 2 lies.

It should be specified that in the context of the present description, the term conduit 3 indicates a body having a channel configured to flow an air flow therein.

Figure 2B:
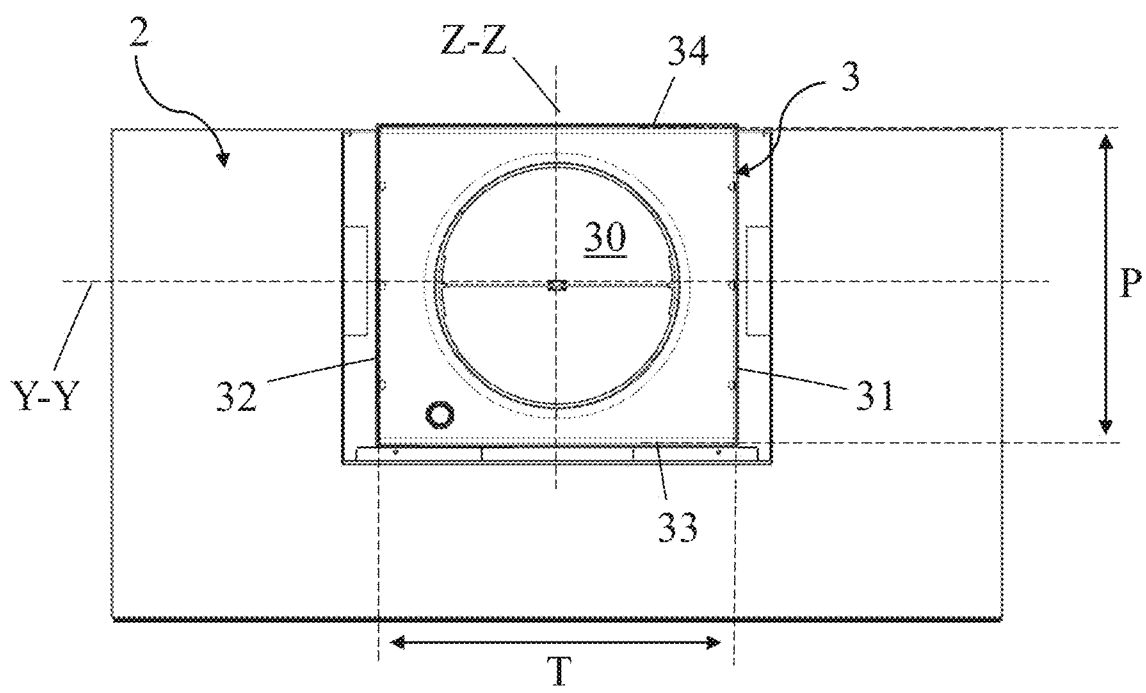

Preferably, as shown in FIG. 2*b*, the conduit 3 has a quadrangular plan section and is delimited along the transverse direction Y-Y by a first side wall 31 and a second side wall 32, and along the depth direction Z-Z by a front wall 33 and a rear wall 34. Even more preferably, the first and the second side wall 31, 32 are parallel and their distance defines the transverse encumbrance T of the conduit 3; similarly, the front and rear wall 33, 34 are parallel and their distance defines the depth P of the conduit 3.

In detail, such a conduit 3 has a discharge opening 30 placed in fluid communication with the intake opening 20 of the base 2, so that the cooking fumes entering the hood 1 by means of the intake opening 20, after having been suitably filtered, can exit from the discharge opening 30 of the conduit 3.

Figure 3:
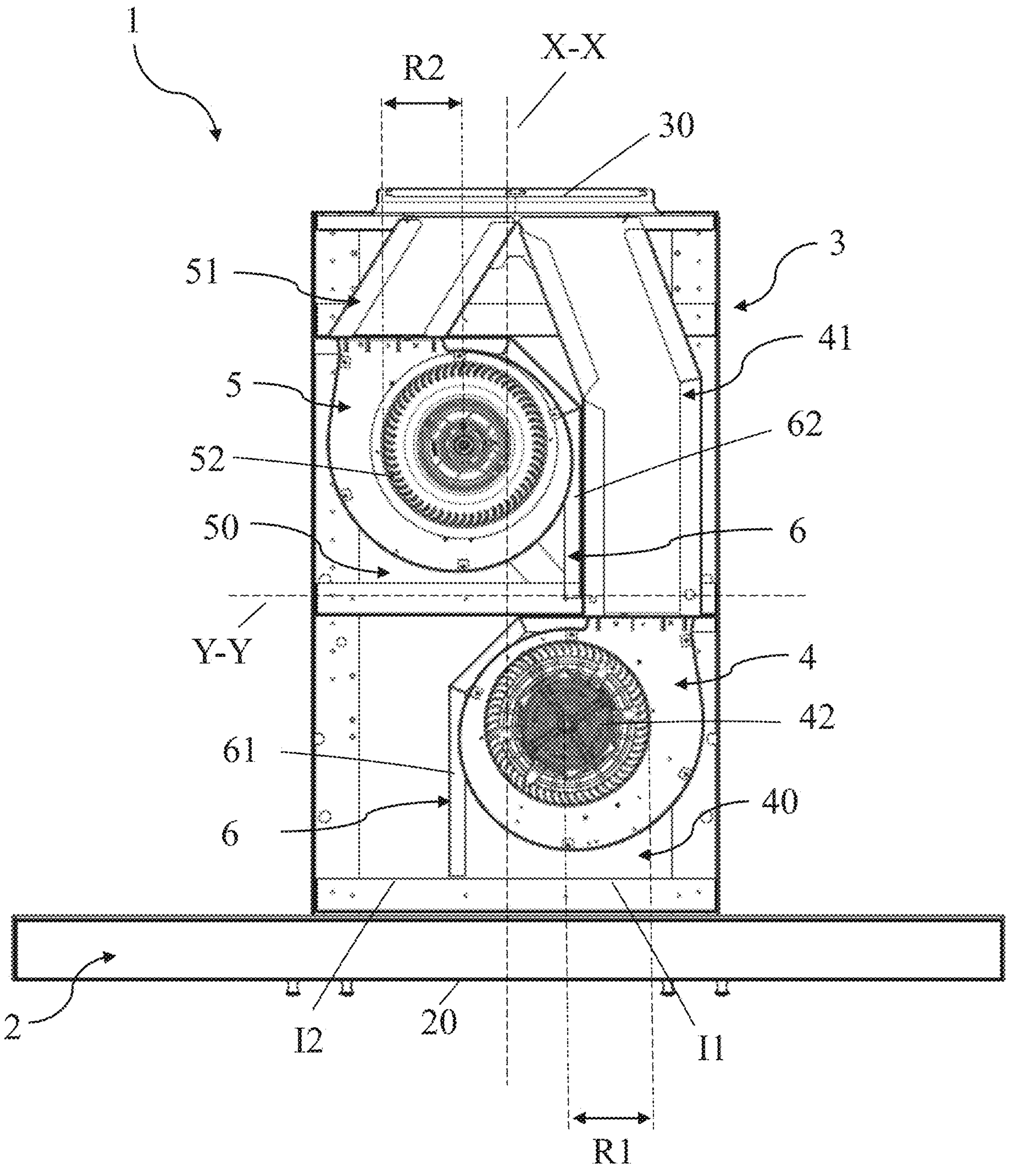
FIG. 3 shows a front partially sectional view of the hood of FIG. 1.
Figure 4:
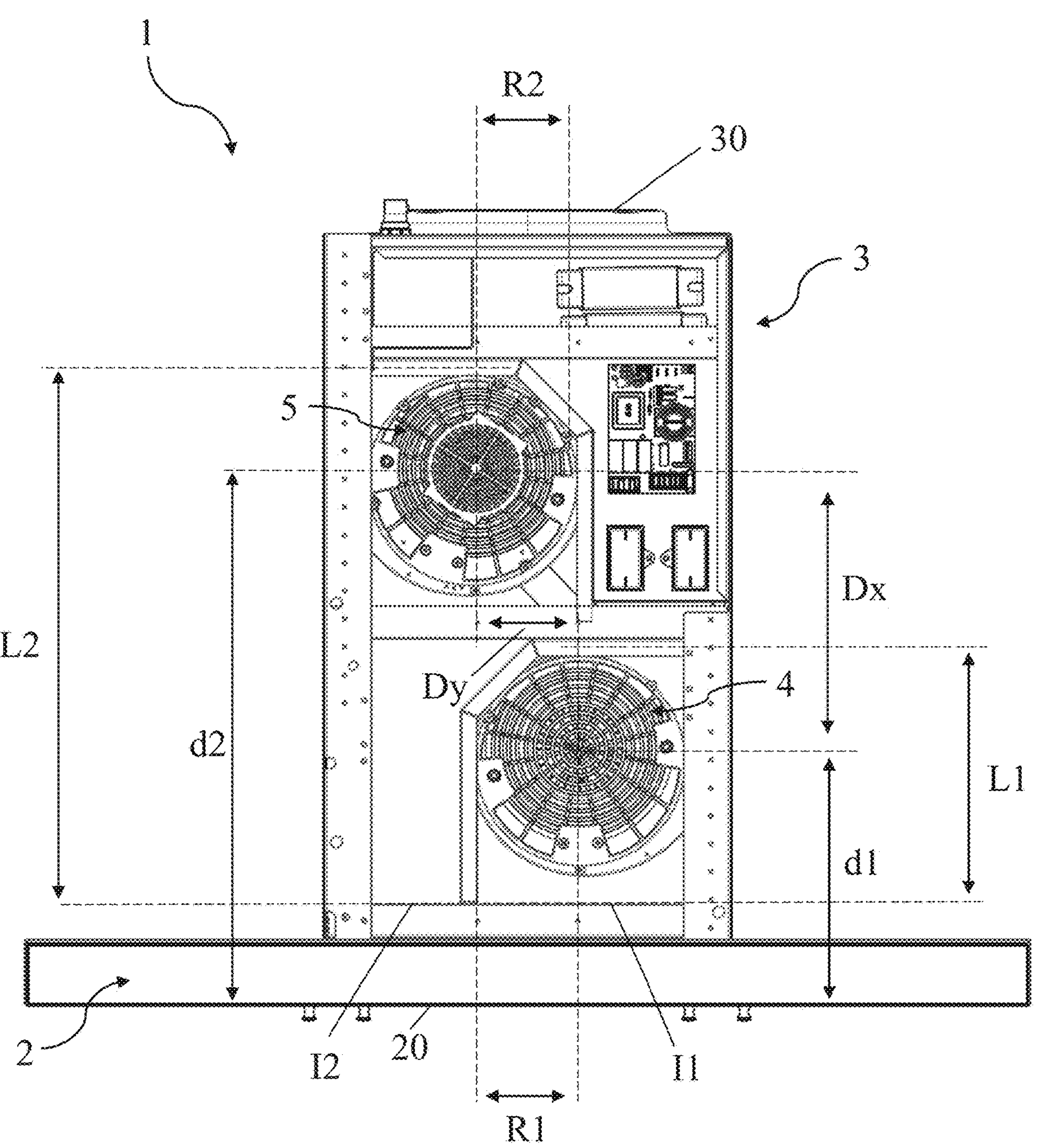
FIG. 4 shows a front view of the hood of FIG. 1 with some parts removed to better illustrate others.

In accordance with what is shown in FIGS. 3 and 4, the discharge opening 30 is arranged on the opposite side of the conduit 3 along the longitudinal direction X-X with respect to the intake opening 20.

It should be specified that the discharge opening 30 can be connected to a flue (not shown in the figures) to pass the extracted cooking fumes outside the room in which the hood 1 is placed, or it can be placed in fluid communication with the environment surrounding the hood 1 itself to pass the extracted cooking fumes therein after having properly filtered them. Hoods of the first type, i.e., those configured to pass the cooking fumes outside the environment in which the hood is placed, are typically referred to as “extractor hoods”; while hoods of the second type, i.e., those configured to pass the cooking fumes into the same environment in which the hood is placed, are commonly called “filter hoods”.

It is thus evident that the hood 1 of the present invention can be used both as an extractor hood and as a filter hood depending on the fluid-dynamic connection of the discharge opening 30.

As shown in FIGS. 3 to 7, the hood 1 further comprises a first and a second suction unit 4, 5 configured to generate respectively a first and a second air flow F1, F2 through the conduit 3 from the intake opening 20 to the discharge opening 30. Preferably, the first and the second suction unit 4, 5 are identical, i.e., they have the same suction capacity in terms of air flow.

Figure 6:
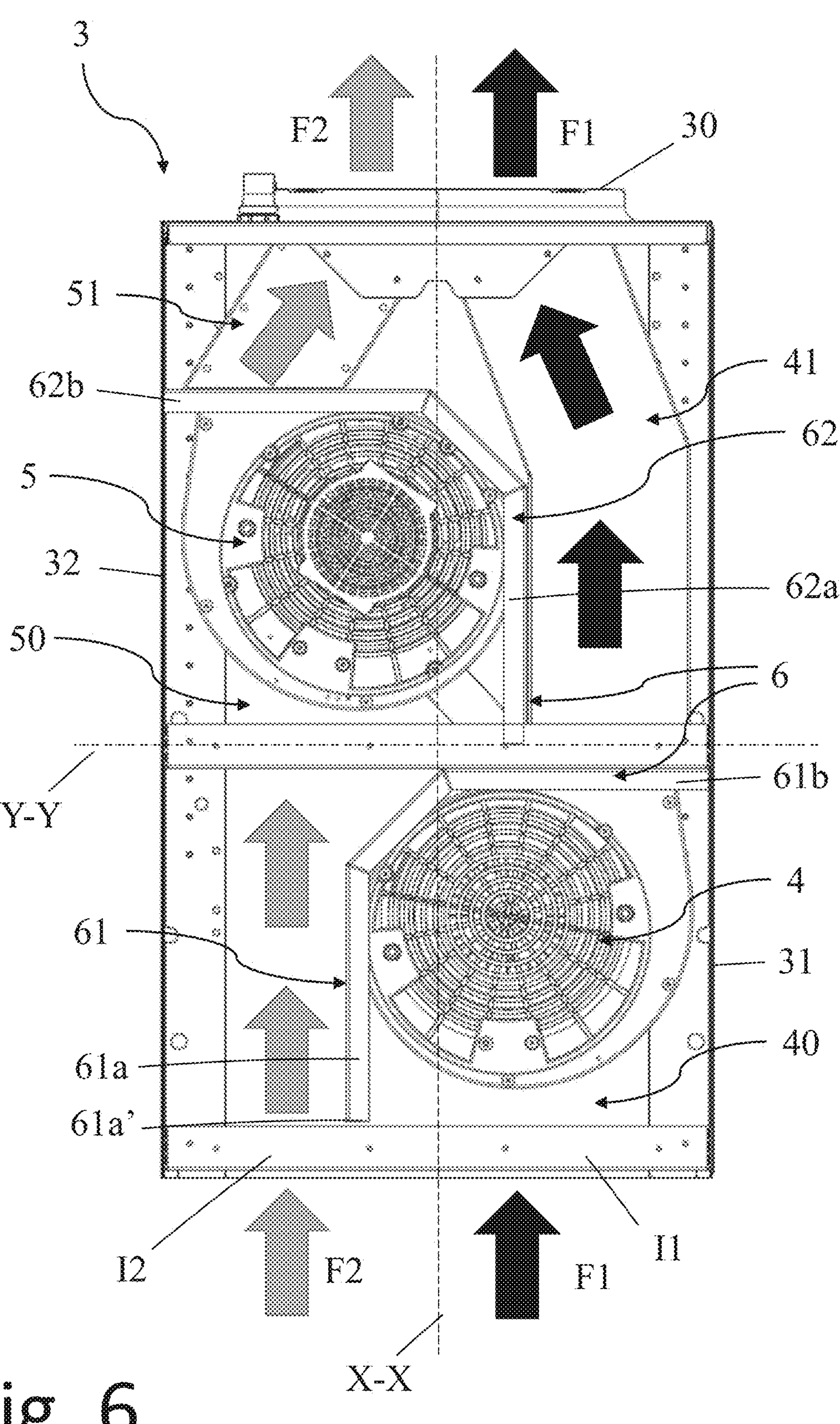
FIG. 6 shows a front view of FIG. 5.

In detail, with particular reference to FIG. 6, the first and the second suction unit 4, 5 are arranged in the conduit 3 so as to be interposed between the intake opening 20 and the discharge opening 30 along the longitudinal direction X-X.

Each suction unit 4, 5 extends parallel to the depth direction Z-Z for the same length.

In greater detail, the first suction unit 4 is placed close to the intake opening 20 and the second suction unit 5 is spaced apart from the first suction unit 4 along the longitudinal direction X-X. More details on the relative position along the longitudinal direction X-X of the suction units 4, 5 are given in a later part of the description.

Figure 5:
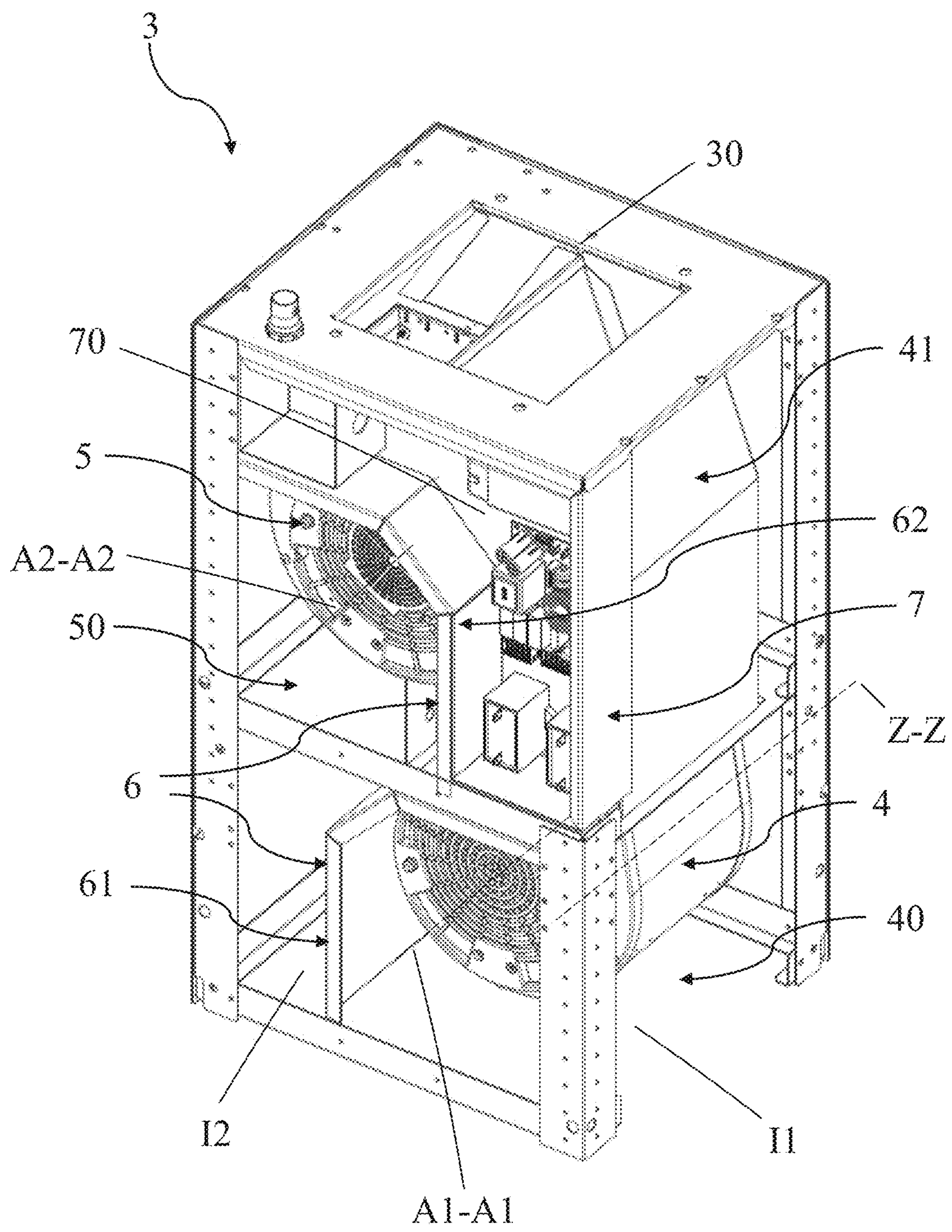
FIG. 5 shows a perspective view of some components of the hood of FIG. 1.

Preferably, in accordance with what is shown in FIGS. 3 and 5, the first and the second suction unit 4, 5 respectively comprise a first impeller 42 and a second impeller 52. The first impeller 42 is configured to be rotated about a first rotation axis A1-A1 by a first electric motor (not shown in the figures); similarly the second impeller 52 is configured to be rotated about a second rotation axis A2-A2 by a second electric motor (not shown in the figures). The first and the second impeller 42, 52, when rotated about the respective rotation axis A1-A1, A2-A2 are configured to generate the first and the second air flow F1, F2.

As shown in FIG. 4, the first rotation axis A1-A1 of the first impeller 42 lies at a first distance d1 from the intake opening 20 along the longitudinal direction X-X; otherwise, the second rotation axis A2-A2 of the second impeller 52 lies at a second distance d2 from the intake opening 20 along the longitudinal direction X-X.

In accordance with what is shown in FIG. 4, the first and the second distance d1, d2 are numerically different, in particular the second distance d2 is greater than the first distance d1.

Thus, it is apparent that the first and the second impeller 42, 52, and thus the first and the second suction unit 4, 5, are mutually spaced along the longitudinal direction X-X. In other words, the fact that the first and the second impeller 42, 52 are at different distances from the intake opening 20 along the longitudinal direction X-X implies that they are mutually spaced along such a longitudinal direction X-X.

As shown in FIGS. 3 and 4, the first and the second suction unit 4, 5 are partially overlapping along the transverse direction Y-Y. Therefore, the projections of the first and the second suction unit 4, 5 on the intake opening 20 are partially overlapping along the transverse direction Y-Y.

It should be noted that the partial overlapping of the first and the second suction unit 4, 5 along the transverse direction Y-Y allows the first side wall 31 to be brought closer to the second side wall 32, thus reducing the transverse encumbrance T of the conduit 3 shown in FIG. 2*b*.

It should be specified that such an overlapping of the first and the second suction unit 4, 5 is achievable because the suction units are spaced along the longitudinal direction X-X. In fact, if this were not the case, i.e., if the suction units 4, 5 were at the same height along the longitudinal direction X-X, they would penetrate along the transverse direction Y-Y, compromising the feasibility of the hood 1.

Preferably, the conduit 3 extends along the transverse direction Y-Y for a length between 300 mm and 600 mm.

Still more preferably, the transverse encumbrance T of the conduit 3 is equal to 401 mm.

With reference to FIG. 3, the first impeller 42 has a first radial extension R1 starting from the first rotation axis A1-A1, while the second impeller 52 has a second radial extension R2 starting from the second rotation axis A2-A2. The first and the second radial extension R1, R2 of the first and the second impeller 42, 52 substantially define the radial encumbrance of the first and the second suction unit 4, 5.

Preferably, the first and the second rotation axis A1-A1, A2-A2 of the first and the second impeller 42, 52 are spaced along the transverse direction Y-Y by a length between 25% and 75% (or between 40% and 60%) of the sum of the first and the second radial extension R1, R2. That is, in the formula:

$$0.25\cdot(R1+R2)<Dy<0.75\cdot(R1+R2)$$

Where Dy indicates the distance between the first and the second rotation axis A1-A1 and A2-A2 along the direction along the transverse direction Y-Y.

Furthermore, preferably, the distance between the first and the second rotation axis A1-A1, A2-A2 of the first and the second impeller 42, 52 along the longitudinal direction X-X is greater than the sum of the first and the second radial extension R1, R2. Still more preferably, the distance between the first and the second rotation axis A1-A1, A2-A2 of the first and the second impeller 42, 52 along the longitudinal direction X-X is at least 10% greater than the sum of the first and the second radial extension R1, R2. That is, in the formula:

$$Dx>1.1\cdot(R1+R2)$$

Where Dx indicates the distance between the first and the second rotation axis A1-A1 and A2-A2 along the longitudinal direction X-X.

With reference to FIGS. 3, 5 and 6, the hood 1 object of the present invention comprises separating means 6 arranged in the conduit 3 to define a first suction chamber 40 and a second suction chamber 50. In other words, such separating means 6 confine an internal volume of the conduit 3 thus defining the first and the second suction chamber 40, 50.

In detail, each suction chamber extends along the longitudinal direction X-X between the intake and discharge opening 20, 30, and is placed in fluid communication with the latter.

The first and the second suction unit 4, 5 are respectively arranged in the first and the second suction chamber 40, 50. It is thus evident that the first and the second air flow F1, F2 generated by the first and the second suction unit 4, 5 totally cross the respective suction chambers 40, 50 along the longitudinal direction X-X to flow from the intake opening 20 to the discharge opening 30.

Figure 8:
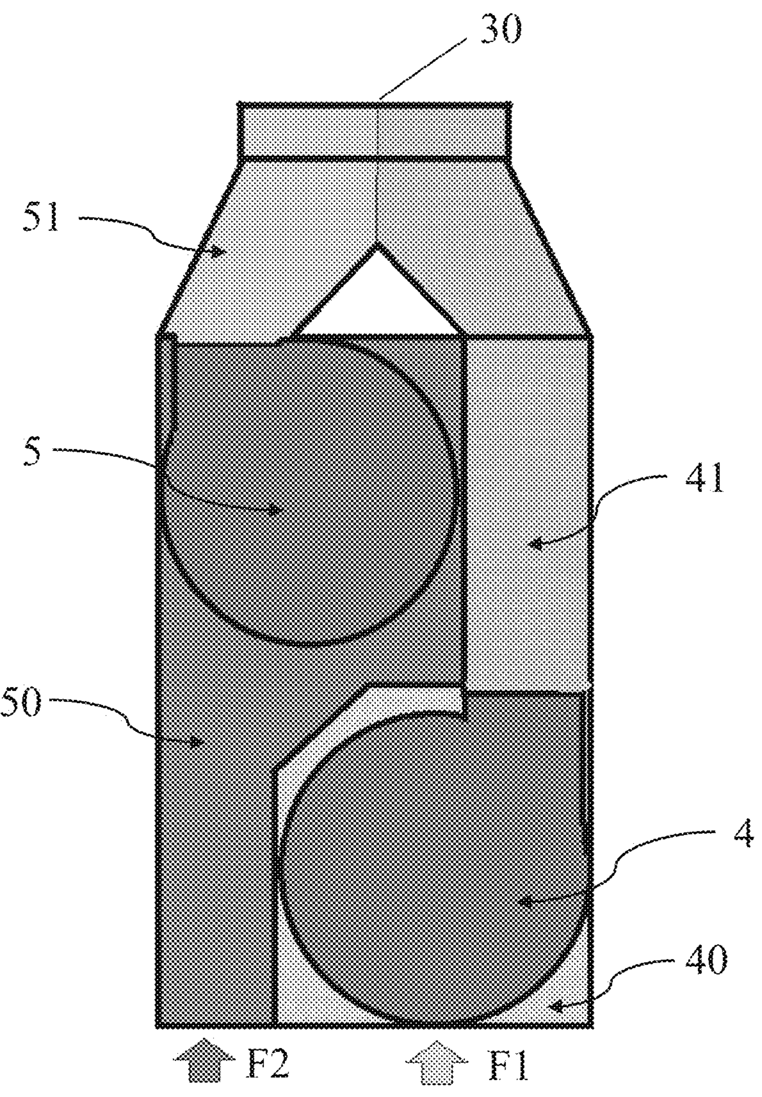
FIG. 8 shows a schematic representation of some components of the hood of FIG. 1.

Preferably, as shown in FIG. 8, the first and the second suction chamber 40, 50 extend complementarily along the longitudinal direction X-X for at least a stretch of the conduit 3.

The first and the second suction chamber 40, 50 respectively comprise a first and a second inlet I1, I2 placed in fluid communication with the intake opening 20 of the base 2.

Preferably, the first and the second inlet I1, I2 are arranged close to the intake opening 20 along the longitudinal direction X-X, so as to be facing the latter. The first and the second air flow F1, F2, after being introduced into the hood 1 through the intake opening 20, respectively enter the first and the second suction chamber 40, 50 via the first and the second inlet I1, I2.

Preferably, the first inlet I1 has a surface extent equal to 1.5-3 times that of the second inlet I2.

It should be specified that the term surface extent of the first and the second inlet I1, I2 means the area of the cross-section through which the first and the second air flow F1, F2 flow before entering the first and the second suction chamber 40, 50, respectively.

The first and the second suction chamber 40, 50 extend along the longitudinal direction X-X starting from the first and the second inlet I1, I2 respectively for a first stretch L1, and a second stretch L2. In detail, as shown in FIG. 4, the second stretch L2 has a greater extension than the first stretch L1.

As shown in FIGS. 3 and 5-7, the separating means 6 adapted to define with the conduit 3 the first and the second suction chamber 40, 50 comprise a first and a second dividing element 61, 62.

In detail, the first and the second dividing element are two distinct bodies available inside the conduit to respectively delimit the first and the second suction chamber 40, 50.

More specifically, each dividing element 61, 62 is substantially L-shaped extending inside the conduit 3 from the front wall 33 and to the rear wall 34.

Each dividing element 61, 62 comprises a first wall 61*a*, 62*a* oriented along the longitudinal direction X-X, and a second wall 61*b*, 62*b* oriented along the transverse direction Y-Y, i.e., perpendicular to the first wall 61*a*, 62*a*.

Preferably, the second wall 61*b* of the first dividing element 61 is fixed to the first side wall 31 of the conduit 3, while the second wall 62*b* of the second dividing element 62 is fixed to the second side wall 32 of the conduit 3. Furthermore, the first wall 62*a* of the second dividing element 62 is fixed to the second wall 61*b* of the first dividing element 61 to separate the first and the second suction chamber 40, 50.

Preferably, according to what is shown in FIG. 6, the first wall 61*a* of the first dividing element 61 comprises a free edge 61*a*' configured to separate the first and the second inlet I1, I2.

Figure 7:
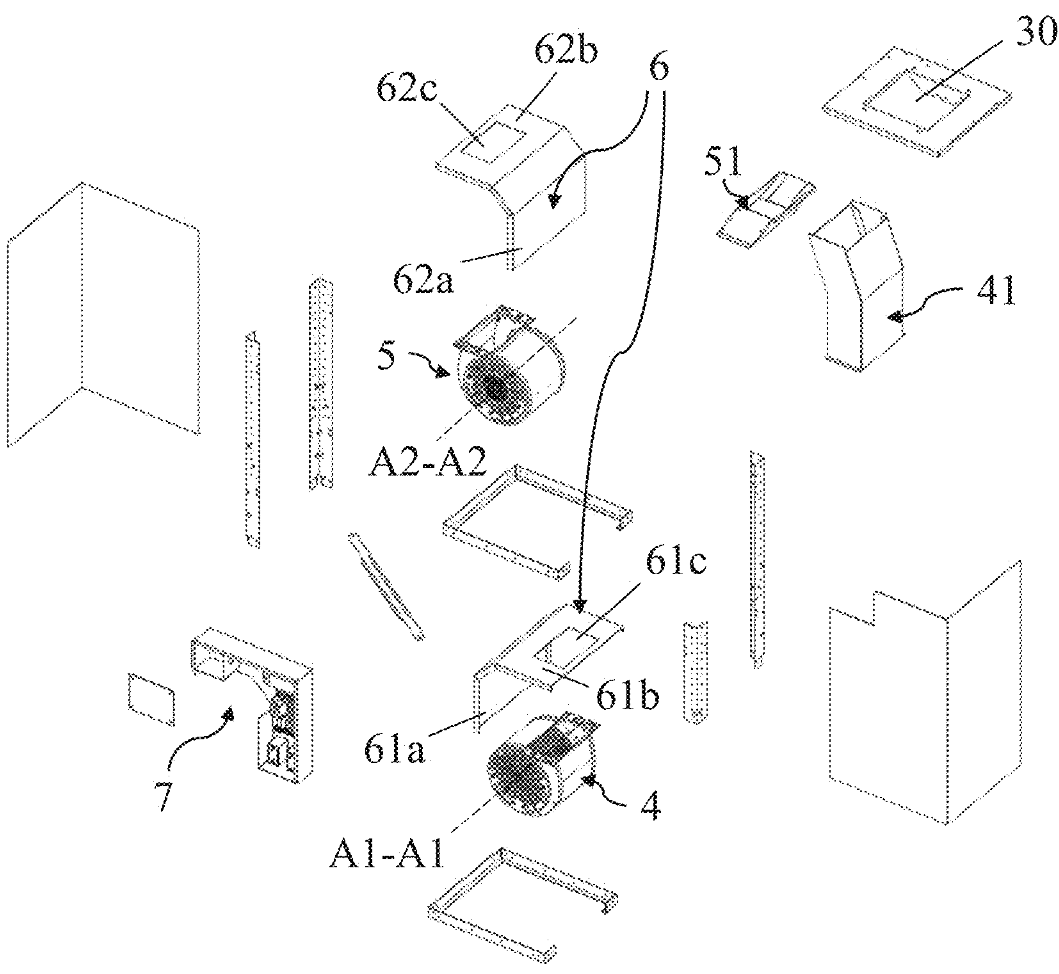
FIG. 7 shows an exploded view of FIG. 5.

As shown in FIG. 7, each second wall 61*b*, 62*b* has an outlet opening 61*c*, 62*c* placed in fluid communication with the discharge opening 30 of the conduit 3.

Preferably, the hood 1 object of the present invention comprises a first discharge conduit 41 and a second discharge conduit 51 arranged in the conduit 3 and configured to put the discharge opening 30 in fluid communication with a respective outlet opening 61*c*, 62*c*.

It should be noted that, in accordance with what is shown in FIG. 6, the first discharge conduit 41 is configured to convey the first air flow F1 from the first suction chamber 40 to the discharge opening 30, while the second discharge conduit 51 is configured to convey the second air flow F2 from the second suction chamber 50 to the discharge opening 30.

Preferably, as shown in FIGS. 3 and 6, the first and the second suction unit 4, 5 respectively comprise a first and a second conveyor 43, 53 configured to convey the respective air flows towards the respective outlet opening 61*c*, 62*c*.

Still more preferably, the first conveyor 43 and the first discharge conduit 41 are connected from opposite sides to the second wall 61*b* of the first dividing element 61 surrounding the relative outlet opening 61*c*. Therefore, the first suction unit 4 is configured to push the first air flow F1 from the first suction chamber 40 towards the first discharge conduit 41 through the relative outlet opening 61*c*.

Similarly, the second conveyor 53 and the second discharge conduit 51 are connected from opposite sides to the second wall 62*b* of the second dividing element 62 surrounding the relative outlet opening 62*c*. Therefore, the second suction unit 5 is configured to push the second air flow F2 from the second suction chamber 50 towards the second discharge conduit 51 through the relative outlet opening 62*c*.

Preferably, as shown in FIGS. 5 and 7, the hood 1 object of the present invention comprises a protective casing 7 having a compartment 70 closed by a wall 31, 32, 33, 34 of the conduit 3 and configured to contain electronic components for the operation and control of the first and the second suction unit 4, 5. The protective casing 7 is arranged outside the first and the second suction chamber 40, 50 and connected to a wall 31, 32, 33, 34 of the conduit 3. Advantageously, the protective casing 7 allows to protect the electronic components of the hood 1 which are sensitive to dust, warmth and moisture.

The invention claimed is:

1. A hood for extracting cooking fumes, the hood comprising:

a base having an intake opening and facing a hob;

a conduit connected to said base and presenting a discharge opening placed in fluid communication with said intake opening of said base, said conduit extending along a longitudinal direction (X-X), said discharge opening being arranged on an opposite side of said conduit with respect to said intake opening along the longitudinal direction (X-X);

a first suction unit and a second suction unit arranged in the conduit and configured to respectively generate a first air flow and a second air flow that cross the conduit from the intake opening to the discharge opening, the first and second suction unit extending in parallel along a depth direction (Z-Z) perpendicular to the longitudinal direction (X-X);

wherein the first suction unit is placed closer to the intake opening than the second suction unit, and the second suction unit is spaced from the first suction unit along the longitudinal direction (X-X), wherein the first suction unit and the second suction unit are partially overlapping along a transverse direction (Y-Y) that is perpendicular to the longitudinal direction (X-X) and to the depth direction (Z-Z), wherein the hood further comprises separating members arranged in the conduit to define a first suction chamber and a second suction chamber, wherein each of the first and second suction chambers is placed in fluid communication with the intake opening and the discharge opening, wherein the first suction unit is placed in the first suction chamber, and the first air flow crosses the first suction chamber to flow from the intake opening to the discharge opening, wherein the second suction unit is placed in the second suction chamber, and the second air flow crosses the second suction chamber to flow from the intake opening to the discharge opening, wherein the separating members comprise a first dividing element and a second dividing element separate from the first dividing element, and wherein each of the first dividing element and the second dividing element is substantially L-shaped and comprises a first wall oriented along the longitudinal direction (X-X) and a second wall oriented along the transverse direction (Y-Y), and wherein the first wall of the second dividing element is connected to the second wall of the first dividing element to separate the first suction chamber and the second suction chamber.

2. The hood of claim 1, wherein:

the first suction unit comprises a first impeller configured to rotate about a first rotation axis oriented parallel to the depth direction (Z-Z) to generate the first air flow, the first rotation axis lying at a first distance from the intake opening;

the second suction unit comprises a second impeller configured to rotate about a second rotation axis oriented parallel to the depth direction (Z-Z) to generate the second air flow, the second rotation axis lying at a second distance from the intake opening; and the second distance is greater than the first distance.

3. The hood of claim 2, wherein the conduit extends along the transverse direction (Y-Y) over a length between 300 mm and 600 mm.

4. The hood of claim 2, wherein:

the first impeller and the second impeller have a first and second radial extension, respectively; and the first rotation axis and the second rotation axis are spaced along the transverse direction (Y-Y) over a length between 25% and 75% of a sum of the first and second radial extensions.

5. The hood of claim 1, wherein the first and second suction chamber respectively comprise a first inlet and a second inlet in fluid communication with the intake opening of the base, the first suction chamber and the second suction chamber extending along the longitudinal direction (X-X) from the first inlet and the second inlet respectively for a first stretch and a second stretch, the second stretch presenting a greater length than the first stretch.

6. The hood of claim 5, wherein the first inlet has a surface extent equal to 1.5-3 times a surface extent of the second inlet.

7. The hood of claim 1, wherein the first dividing element is connected internally to the conduit to define the first suction chamber; and the second dividing element is connected internally to the conduit to define the second suction chamber.

8. The hood of claim 7, wherein the first wall and the second wall of each dividing element extend from side to side of the conduit along the depth direction (Z-Z).

9. The hood of claim 1, further comprising:

a first discharge conduit arranged in the conduit and configured to convey the first air flow from the first suction chamber to the discharge opening; and a second discharge conduit arranged in the conduit and configured to convey the second air flow from the second suction chamber to the discharge opening.

* * * * *